(12) United States Patent
Hwang et al.

(10) Patent No.: US 7,936,620 B2
(45) Date of Patent: May 3, 2011

(54) RECEIVER OF SEMICONDUCTOR MEMORY APPARATUS

(75) Inventors: Tae-Jin Hwang, Gyeonggi-do (KR);
Yong-Ju Kim, Gyenoggi-Do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Hae-Rang Choi, Gyeonggi-do (KR);
Ji-Wang Lee, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 138 days.

(21) Appl. No.: 12/483,413

(22) Filed: Jun. 12, 2009

(65) Prior Publication Data

US 2010/0034033 A1 Feb. 11, 2010

(30) Foreign Application Priority Data

Aug. 8, 2008 (KR) .................. 10-2008-0077694

(51) Int. Cl.
*G11C 7/00* (2006.01)
(52) U.S. Cl. .............. 365/191; 365/189.05; 365/189.11; 327/74; 327/85
(58) Field of Classification Search .................. 365/191, 365/189.05, 189.11; 327/74, 85
See application file for complete search history.

(56) References Cited

U.S. PATENT DOCUMENTS

| 6,184,738 | B1 | 2/2001 | Iwamoto et al. |
| 6,282,129 | B1 * | 8/2001 | Khoury et al. ........... 365/189.16 |
| 6,373,283 | B2 | 4/2002 | Matsumoto |
| 6,744,284 | B2 | 6/2004 | Yoo et al. |
| 7,719,323 | B2 * | 5/2010 | Song et al. ...................... 327/74 |
| 7,733,727 | B2 * | 6/2010 | Hwang et al. ................. 365/207 |
| 7,825,699 | B2 * | 11/2010 | Hwang et al. .................... 327/55 |

FOREIGN PATENT DOCUMENTS

| JP | 2003-273938 | 9/2003 |
| KR | 10-1999-0086334 | 12/1999 |

* cited by examiner

*Primary Examiner* — Tuan T Nguyen
*Assistant Examiner* — Toan Le
(74) *Attorney, Agent, or Firm* — Venable LLP; Jeffri A. Kaminski

(57) ABSTRACT

A receiver of a semiconductor memory apparatus includes a first input transistor configured to be turned ON when an input signal is equal to or more than a predetermined level; a second input transistor configured to be turned ON when the input signal is equal to or less than the predetermined level; a first output node voltage control unit configured to increase a voltage level of an output node when the first input transistor is turned ON; a second output node voltage control unit configured to decrease the voltage level of the output node when the second input transistor is turned ON; a third input transistor configured to increase the voltage level of the output node when an inversion signal of the input signal is equal to or less than the predetermined voltage level; and a fourth input transistor configured to decrease the voltage level of the output node when the inversion signal of the input signal is equal to or more than the predetermined voltage level.

9 Claims, 1 Drawing Sheet

RECEIVER OF SEMICONDUCTOR MEMORY APPARATUS

CROSS-REFERENCES TO RELATED PATENT APPLICATION

The present application claims priority under 35 U.S.C 119(a) to Korean Application No. 10-2008-0077694, filed on Aug. 8, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a receiver.

2. Related Art

In general, a receiver used in a semiconductor memory apparatus transmits a signal inputted from the outside of the semiconductor memory apparatus to an internal circuit of the semiconductor memory apparatus. Therefore, the receiver needs not to distort the signal or generate noise when transmitting the signal inputted from the outside to the internal circuit.

However, the receiver operates by receiving the signal inputted from the outside through only a gate of an NMOS transistor or only a gate of a PMOS transistor. The receiver that receives the input signal through the gate of the NMOS transistor is turned OFF when the input signal is at a low level and turned ON when the input signal is at a high level. Meanwhile, the receiver that receives the input signal through the gate of the PMOS transistor is turned OFF when the input signal is at a high level and turned ON when the input signal is at a low level.

In the case of the receiver that receives the input signal through the gate of the NMOS transistor or the PMOS transistor, when the input signal is transitioned to a low level from a high level or to a high level from a low level, all the transistors that receives the input signal may be turned OFF. When all the transistors that receive the input signal are turned OFF, an output node that determines a level of an output signal of the receiver is subjected to a floating state, such that the output signal may be transitioned to a level irrelevant to the input signal. Such a problem becomes serious as the input signal of the receiver has a higher frequency.

SUMMARY

A receiver of a semiconductor memory apparatus that can consecutively output an output signal in response to an input signal even at the timing when the input signal is transitioned is disclosed herein.

In one embodiment, a receiver of a semiconductor memory apparatus includes a first input transistor configured to be turned ON when an input signal is equal to or more than a predetermined level; a second input transistor configured to be turned ON when the input signal is equal to or less than the predetermined level; a first output node voltage control unit configured to increase a voltage level of an output node when the first input transistor is turned ON; a second output node voltage control unit configured to decrease the voltage level of the output node when the second input transistor is turned ON; a third input transistor configured to increase the voltage level of the output node when an inversion signal of the input signal is equal to or less than the predetermined voltage level; and a fourth input transistor configured to decrease the voltage level of the output node when the inversion signal of the input signal is equal to or more than the predetermined voltage level.

In another embodiment, a receiver of a semiconductor memory apparatus includes a first input section, which is driven by a difference of a voltage level between a first node and a second node, configured to connect the first node to an output node when an input signal is at a high level and connect the second node to the output node when the input signal is at a low level; and a second input section configured to connect the second node to the output node when an inversion signal of the input signal is at a high level and connect the first node to the output node when the inversion signal of the input signal is at a low level.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
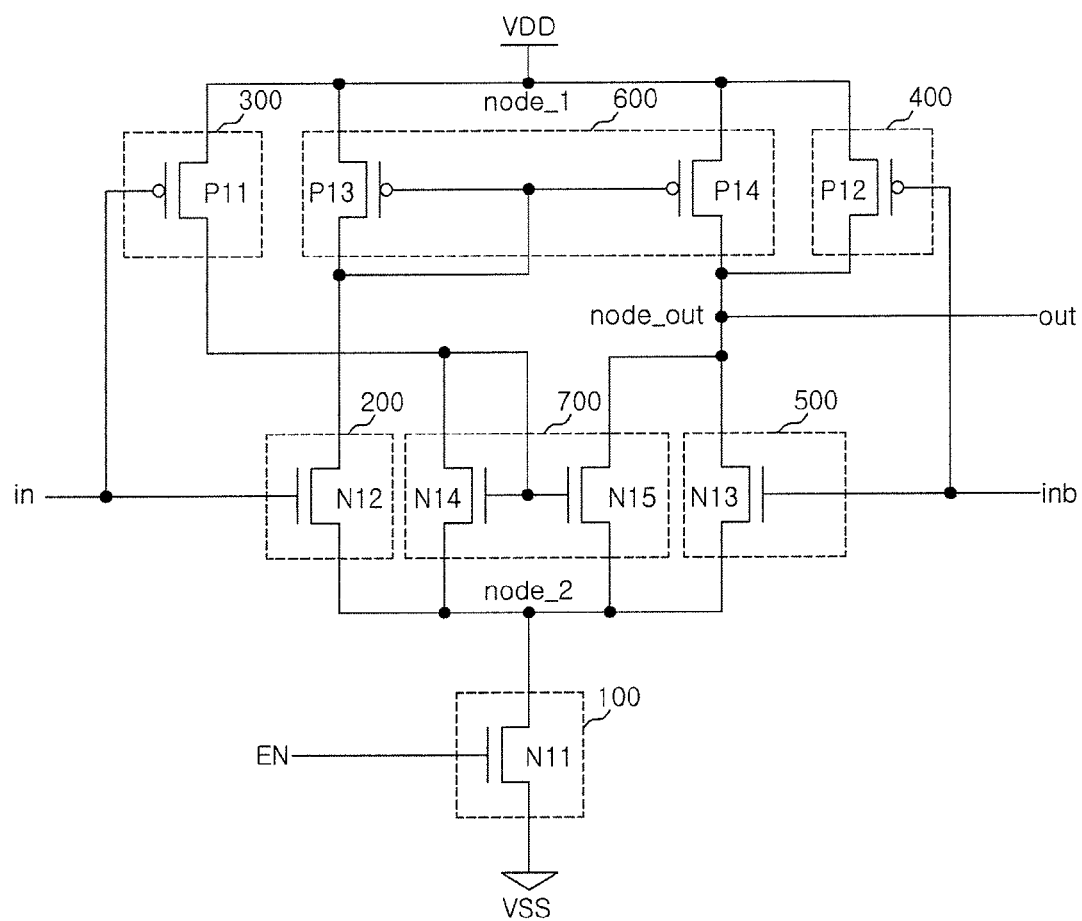
FIG. 1 is a block diagram schematically showing a configuration of an exemplary receiver of a semiconductor memory apparatus according to one embodiment.

A receiver of a semiconductor memory apparatus according to one embodiment can be configured to include an activation unit 100, first to fourth input transistors 200 to 500, and first and second output node voltage control units 600 and 700 as shown in FIG. 1. At this time, an external voltage VDD is applied to a first node node_1.

The activation unit 100 can connect a second node node_2 with a ground terminal VSS when an enable signal 'EN' is enabled.

The activation unit 100 can be configured to include a first transistor N11. The first transistor N11 receives the enable signal 'EN' at a gate thereof, is connected to the second node node_2 at a drain thereof, and is connected to the ground terminal VSS at a source thereof.

The first input transistor 200, N12 is turned ON when an input signal 'in' is at a high level.

The first input transistor 200, N12 receives the input signal 'in' at a gate thereof and is connected to the second node node_2 at a source thereof.

The second input transistor 300, P11 is turned ON when the input signal 'in' is at a low level.

The second input transistor 300, P11 receives the input signal 'in' at a gate thereof and is connected to the first node node_1 at a source thereof.

The third input transistor 400, P12 is turned ON when an inversion input signal 'inb' is at a low level to apply an external voltage VDD to an output node node_out.

The third input transistor 400, P12 receives the inversion input signal 'inb' at a gate thereof, is connected to the first node node_1 at a source thereof, and is connected to the output node node_out at a drain thereof.

The fourth input transistor 500, N13 is turned ON when the inversion signal 'inb' is at a high level to connect the second node node_2 with the output node node_out.

The fourth input transistor 500, N13 receives the inversion signal 'inb' at a gate thereof, is connected to the output node node_out at a drain thereof, and is connected to the second node node_2 at a source thereof.

The first output node voltage control unit 600 can apply the external voltage VDD to the output node node_out when the first input transistor N12 is turned ON.

The first output node voltage control unit 600 can be configured to include second and third transistors P13 and P14. The second transistor P13 is connected to the first node node_1 at a source thereof, and is connected to the drain of the first input transistor N12 at a gate and a drain thereof. The third transistor P14 is connected to the gate of the first transistor P13 at a gate thereof, is connected to the first node node_1 at a source thereof, and is connected to the output node node_out at a drain thereof.

The second output node voltage control unit 700 can connect the second node node_2 to the output node node_out when the second input transistor P11 is turned ON.

The second output node voltage control unit 700 can be configured to include fourth and fifth transistors N14 and N15. The fourth transistor N14 is connected to the source of the second input transistor P11 at a gate and a drain thereof, and is connected to the second node node_2 at a source thereof. The fifth transistor N15 is connected to the gate of the fourth transistor N14 at a gate thereof, is connected to the output node node_out at a drain thereof, and is connected to the second node node_2 at a source thereof.

An operation of the exemplary receiver of the semiconductor memory apparatus will be described below.

When the enable signal 'EN' is enabled, the activation unit 100 is turned ON, that is, the first transistor N11 is turned ON. The first transistor N11 is turned ON to connect the second node node_2 with the ground terminal VSS.

The input signal 'in' has a phase opposite to the inversion input signal 'inb'.

When the input signal 'in' is at a high level, the first input transistor N12 is turned ON. When the first input transistor N12 is turned ON, the first output node voltage control unit 600 can apply the external voltage VDD to the output node node_out.

Further, when the input signal 'in' is at a high level, the inversion input signal 'inb' is at a low level, such that the third input transistor P12 is turned ON. The turned-ON third input transistor P12 can apply the external voltage VDD to the output node node_out.

Consequently, the receiver can output an output signal 'out' of the high level when the input signal 'in' is at a high level.

Meanwhile, when the input signal 'in' is at a low level, the second input transistor P11 is turned ON. When the second input transistor P11 is turned ON, the second output node voltage control unit 700 can connect the second node node_2 which is a ground level to the output node node_out.

When the input signal 'in' is at a low level, the inversion input signal 'inb' is at a high level, such that the fourth input transistor N13 is turned ON. The turned-ON fourth input transistor N13 can connect the second node node_2 which is the ground level to the output node node_out.

Consequently, the receiver can output an output signal 'out' of the low level when the input signal 'in' is at a low level.

At this time, the first and second input transistors 200 and 300 and the first and second output node voltage control units 600 and 700 that determine the voltage level of the output node node_out in response to the input signal 'in' may be referred to as a first input section and the third and fourth input transistors 400 and 500 that determine the voltage level of the output node node_out in response to the inversion input signal 'inb' may be referred to as a second input section.

As described above, a receiver of a semiconductor memory apparatus according to one embodiment can include a first input transistor that is turned ON when an input signal is at a high level and a second input transistor that is turned ON when the input signal is at a low level. The first input transistor is configured to be turned ON when a voltage level of the input signal is equal to or less than a predetermined voltage level and the second input transistor is configured to be turned ON when the voltage level of the input signal is equal to or more than the predetermined voltage level. The receiver of the semiconductor memory apparatus can consecutively output an output signal even when the input signal is transitioned, thereby increasing operational reliability of the semiconductor memory apparatus.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A receiver of a semiconductor memory apparatus, comprising:
    a first input transistor configured to be turned ON when an input signal is equal to or more than a predetermined level;
    a second input transistor configured to be turned ON when the input signal is equal to or less than the predetermined level;
    a first output node voltage control unit configured to increase a voltage level of an output node when the first input transistor is turned ON;
    a second output node voltage control unit configured to decrease the voltage level of the output node when the second input transistor is turned ON;
    a third input transistor configured to increase the voltage level of the output node when an inversion signal of the input signal is equal to or less than the predetermined voltage level; and
    a fourth input transistor configured to decrease the voltage level of the output node when the inversion signal of the input signal is equal to or more than the predetermined voltage level.

2. The receiver of claim 1, wherein the first input transistor is an NMOS transistor which is coupled to the first output node voltage control unit and the second input transistor is a PMOS transistor which is coupled to the second output node voltage control unit.

3. The receiver of claim 2, wherein the first output node voltage control unit increases the voltage level of the output node when the first input transistor is turned ON to decrease a voltage level of a node connected to the first output node voltage control unit, and
    wherein the second output node voltage control unit decreases the voltage level of the output node when the second input transistor is turned ON to increase a voltage level of a node connected to the second output node voltage control unit.

4. The receiver of claim 1, wherein the third input transistor is the PMOS transistor and the fourth input transistor is the NMOS transistor.

5. A receiver of a semiconductor memory apparatus, comprising:
    a first input section, which is driven by a difference of a voltage level between a first node and a second node, configured to connect the first node to an output node when an input signal is at a high level and connect the second node to the output node when the input signal is at a low level; and a second input section configured to connect the second node to the output node when an inversion signal of the input signal is at a high level and connect the first node to the output node when the inversion signal of the input signal is at a low level.

6. The receiver of claim 5, wherein the first input section includes:

a first input transistor configured to be turned ON when the input signal is at a high level;

a second input transistor configured to be turned ON when the input signal is at a low level;

a first output node voltage control unit configured to couple the first node to the output node when the first input transistor is turned ON; and a second output node voltage control unit configured to couple the second node to the output node when the second input transistor is turned ON.

7. The receiver of claim 6, wherein the first input transistor is an NMOS transistor and the second input transistor is a PMOS transistor.

8. The receiver of claim 5, wherein the second input section includes:

a first input transistor configured to couple the second node to the output node when the inversion signal is at a high level; and a second input transistor configured to couple the first node to the output node when the inversion signal is at a low level.

9. The receiver of claim 8, wherein the first input transistor comprises a NMOS transistor and the second input transistor comprises a PMOS transistor.

* * * * *